United States Patent [19]
Gardner et al.

[11] Patent Number: 6,152,075
[45] Date of Patent: Nov. 28, 2000

[54] METHOD AND SYSTEM FOR HEATING SEMICONDUCTOR WAFERS

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/143,605

[22] Filed: Aug. 31, 1998

[51] Int. Cl.[7] .................................................. C23C 16/00
[52] U.S. Cl. ...................... 118/730; 118/715; 118/728; 118/729; 118/504
[58] Field of Search .................................. 118/715, 728, 118/729, 724, 504, 730

[56] References Cited

U.S. PATENT DOCUMENTS

| | | | |
|---|---|---|---|
| 4,920,918 | 5/1990 | Adams et al. | 118/724 |
| 5,044,314 | 9/1991 | McNeilly | 118/715 |
| 5,080,039 | 1/1992 | Kanegae et al. | 118/725 |
| 5,748,295 | 5/1998 | Farmer | 356/5.09 |
| 5,759,281 | 6/1998 | Gurari et al. | 118/725 |
| 5,916,370 | 6/1999 | Chang | 118/729 |

*Primary Examiner*—Deborah Jones
*Assistant Examiner*—Lymarie Miranda

[57] ABSTRACT

The present disclosure relates to a chemical vapor deposition system including a chemical vapor deposition chamber having a wafer position at which a wafer can be placed during chemical wafer deposition processing, and a source of reactive gases for providing reactive gases to the chemical vapor deposition chamber. This system also includes a coherent radiation source for directing a beam of coherent radiation toward the wafer position, and a shield positioned between the coherent radiation source and the wafer position. This shield is adapted to distribute energy from the beam of coherent radiation across the wafer when the wafer is located at the wafer position.

38 Claims, 2 Drawing Sheets

METHOD AND SYSTEM FOR HEATING SEMICONDUCTOR WAFERS

FIELD OF THE INVENTION

The present invention relates generally to systems and methods for manufacturing semiconductor wafers. More particularly, the present invention relates to systems and methods for heating semiconductor wafers during chemical vapor deposition processing.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicabilities and numerous disciplines.

Semiconductor devices are commonly fabricated on silicon wafers by introducing sequentially stacked patterned layers, such as conductive, dielectric and capping layers, on the surfaces of the wafers. Chemical vapor deposition systems are commonly used to deposit films or layers on semiconductor wafers.

Chemical vapor deposition systems are typically equipped with the following components: (1) a chemical vapor deposition chamber; (2) deposition or reactive gas sources; (3) inlet lines for transferring gas from the gas sources into the deposition chamber; (4) a mechanism, such as a halogen lamp, for heating the wafers on which the film is to be deposited; (5) an outlet line; and (6) a vacuum source or pump for evacuating the compression chamber through the outlet line.

Heating uniformity and accuracy are important aspects of an effective chemical vapor deposition system.

SUMMARY OF THE INVENTION

One aspect of the present invention relates to a chemical vapor deposition system including a chemical deposition chamber having a wafer position at which a wafer can be placed during chemical vapor deposition processing, and a source reactive gases for providing reactive gases to the chemical vapor deposition chamber. The system also includes a coherent radiation source for directing a beam of coherent radiation toward the wafer position, and a shield positioned between the coherent radiation source and the wafer position. The shield is adapted for distributing energy from the beam of coherent radiation across the wafer when the wafer is located at the wafer position.

Another aspect of the present invention relates to a method for heating a semiconductor wafer during a chemical vapor deposition process. The method includes the steps of providing a coherent radiation source, and providing a shield positioned between the coherent radiation and the wafer. The method also includes the steps of directing a beam of coherent radiation from the coherent radiation source to the shield, and using the shield to distribute energy from the beam of coherent radiation across the wafer.

A variety of advantages of the invention will be set forth in part in the description that follows, and in part will be apparent from the description, or may be learned by practicing the invention. It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of the specification, illustrate several aspects of the invention and together with the description, serve to explain the principles of the invention. A brief description of the drawings is as follows.

DETAILED DESCRIPTION

Reference will now be made in detail to exemplary aspects of the present invention which are illustrated in the accompanying drawings. Wherever possible, the same reference numbers will be used throughout the drawings to refer to the same or like parts.

As previously described, semiconductor devices are commonly fabricated on silicon wafers by depositing, through chemical vapor deposition techniques, sequentially stacked layers or films on the surfaces of the wafers. As used throughout this specification and claims, the terms "semiconductor wafer" or "wafer" are intended to include wafer substrates as well as wafers having any number of stacked or patterned layers. Furthermore, these terms are intended to include all types of semiconductor/integrated circuit devices as well as precursor semiconductors/semiconductor devices.

Figure 1:
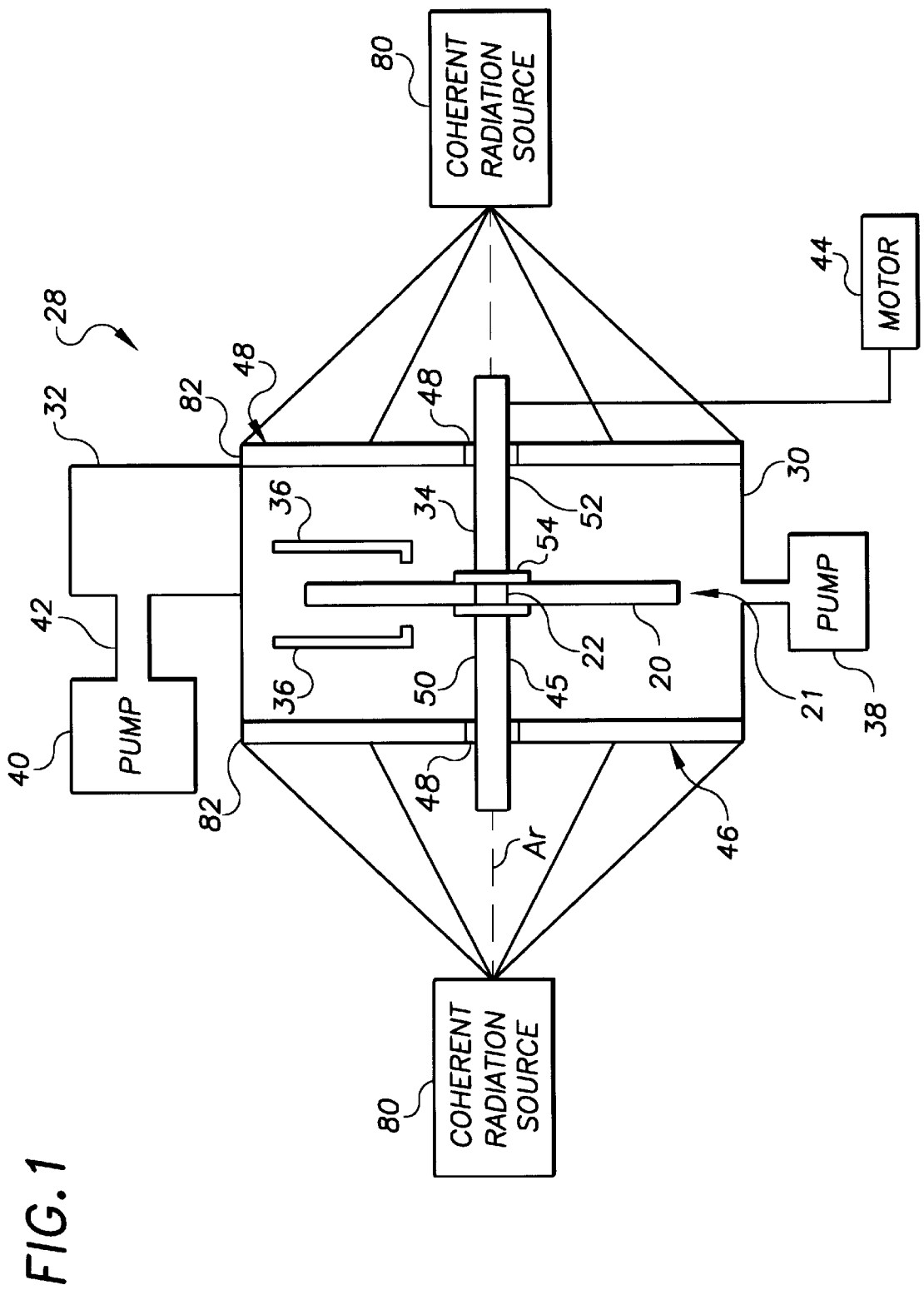
FIG. 1 is a schematic illustration of an embodiment of a chemical vapor deposition system constructed in accordance with the principles of the present invention.

FIG. 1 illustrates a chemical vapor deposition system 28 constructed in accordance with the principles of the present invention. Generally, the system 28 includes a chemical vapor deposition chamber 30 and a load lock 32 for supplying wafers to the chamber 30. A rotatable member 34 extends across the chemical vapor deposition chamber 30. A circlet wafer 20 is mounted on the rotatable member 34 at a wafer position 21 within the chemical vapor deposition chamber 30. Jet gas injectors 36 are used to direct reactive gases or precursor gases toward the circlet wafer 20. A small pump 38 and a large pump 40 are used to differentially pump the chemical vapor deposition chamber 30 down to base pressure (i.e., in the range of $10^{-1}$ to $10^{-3}$ torr) prior to processing. The large pump 40 also functions to exhaust waste byproduct from the deposition chamber 30 through outlet line 42. A drive mechanism 44, such as an electric motor or other type of conventional device for imparting rotation, is used to rotate the rotatable member 34 about a longitudinal axis of rotation $A_r$.

The system 28 also includes a heating mechanism for heating the deposition chamber 30 during deposition processing. For example, the system 28 includes coherent radiation sources 80 for directing beams of coherent radiation toward the wafer position 21. The heating mechanism also includes shields 82 positioned between the coherent radiation sources 80 and the wafer position 21. When the beams of coherent radiation are directed on the shields 82, the shields distribute energy from the beams of coherent radiation across the wafer 20 such that the wafer is uniformly heated. While two separate shields and coherent radiation sources are shown, a single coherent radiation source and shield can also be used.

The rotatable member 34 of the chemical vapor deposition system 28 includes an elongated drive shaft 45 that extends through opposite sidewalls 46 of the chemical vapor deposition chamber 30, and a circlet hub 54 that is mounted within the central opening 22 of the circlet wafer 20. Seals 48 such as o-rings or ferro-fluidic seals provide fluid tight seals between the sidewalls 46 and the drive shaft 45. The drive shaft 45 includes first and second separate rods 50 and 52 that fit within or interlock with the circlet hub 54.

To facilitate mounting the circlet wafer 20 on the drive shaft 45, it is preferred to have two separate rods 50 and 52 as described above. For example, the circlet wafer 20 can be removed from the drive shaft 45 by axially sliding or retracting the first and second rods 50 and 52 away from one another such that the rods 50 and 52 disengage from the circlet hub 54. When the rods 50 and 52 disengage from the hub 54, the circlet wafer 20 can be removed from the chamber 30. A new circlet wafer can then be mounted on the drive shaft 45 by positioning the circlet wafer between the first and second rods 50 and 52, centering the circlet wafer on the axis of rotation $A_r$, and then axially sliding the first and second rods 50 and 52 together such that the rods interlock with the circlet hub of the new wafer. It will be appreciated that conventional automation technology can be used to axially slide the rods 50 and 52, and to load and unload the wafer 20 between the rods 50 and 52. For example, the rods 50 and 52 can be moved by conventional stepper or servo motors, and wafers can be positioned within the chamber by a conventional wafer transfer mechanism. It will also be appreciated that only one of the rods 50 and 52 needs to be moved relative to the other of the rods in order to provide clearance for inserting a wafer between the rods.

While a two piece drive shaft is described above, it will be appreciated that in certain embodiments of the present invention the drive shaft 45 can be a single piece. In such an embodiment, a circlet wafer can be mounted on the drive shaft by holding the circlet wafer in alignment with the shaft through the use of a wafer transfer mechanism, and then axially sliding the drive shaft through the circlet wafer. Similarly, the circlet wafer can be removed from the shaft by holding the wafer with a wafer transfer mechanism, and then sliding the shaft relative to the wafer such that the wafer passes over an end of the shaft.

Referring back to FIG. 1, the drive shaft 45 and the axis of rotation $A_r$ are generally horizontal, while the circlet wafer 20 is transversely aligned with respect to the axis of rotation $A_r$ and is aligned in a generally vertical plane. The circlet wafer 20 is centered about the axis of rotation $A_r$ and the gas injectors 36 are positioned on opposite sides of the circlet wafer 20. During deposition processing, the rotatable member 34 and the circlet wafer 20 are rotated in unison (i.e., at rotational speeds in the range of 10–300 rotations per minute), and reactant gases are directed from the gas injectors 36 toward the sides of the circlet wafer 20. The reactant gases are directed against the sides of the circlet wafer 20 and flow in an upward direction toward the outlet line 42.

The coherent radiation sources 80 can be any radiation sources that use stimulated emission processes. For example, a mazer that generates coherent microwave (i.e., having a wave length less than 1 millimeter) radiation can be used. By way of example, the mazer can have a power in the range of 0.01–10 watts. Other exemplary sources of coherent radiation include lasers, magnatrons, and klystrons.

Figure 2:
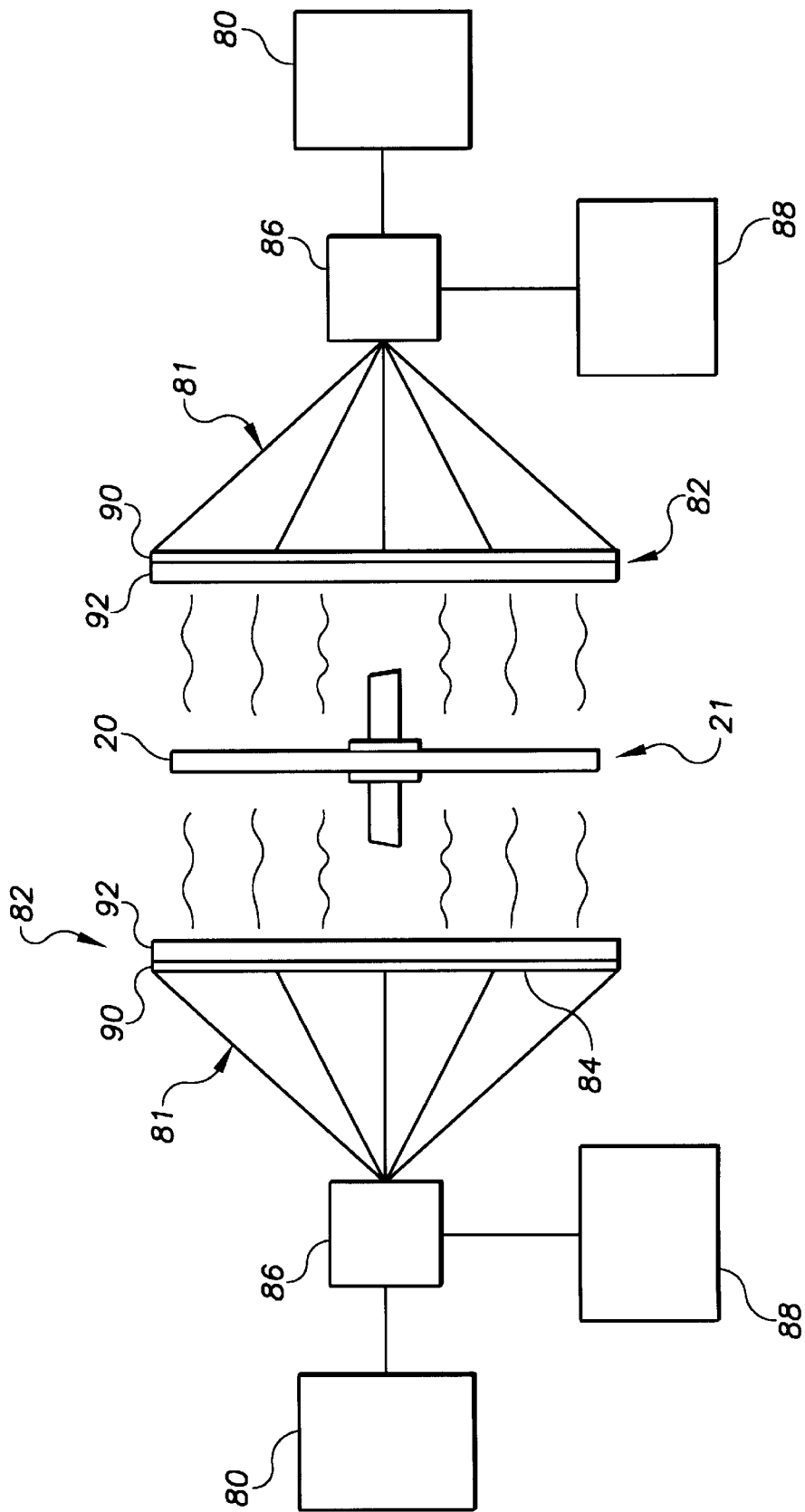
FIG. 2 is a cross-sectional view cut through a shield adapted for use in the system of FIG. 1.

As shown in FIG. 2, the beams of coherent radiation from the coherent radiation sources 80 are preferably scanned across front surfaces 84 of the shields 82 in order to uniformly heat the shields 82. The beams of coherent radiation can be scanned by any number of conventional techniques such as electro-optical, acousto-optical and electro-mechanical techniques. For example, the beams of coherent radiation can be electro-mechanically scanned by mirrors 86 that are moved by drive mechanisms 88 such as stepper motors or servo motors. By directing the beams of coherent radiation at the mirrors 86, and moving the mirrors 86 in a predetermined manner, the beams of coherent radiation can be scanned in predetermined patterns 81 along the front surfaces 84 of the shields 82. It will be appreciated that the drive mechanisms 88 can be software controlled so as to provide the desired scanning patterns. Heating uniformity on the shields can be tuned or altered by changing the scanning patterns of the beams of coherent radiation.

As shown in FIG. 1, the shields 82 form the structural side walls 46 of the chemical vapor deposition chamber 30. In alternative embodiments, a shield can be positioned completely within the chemical vapor deposition chamber. In such embodiments, a window made of a material such as quartz can be provided for allowing beams of coherent radiation to be directed into the chamber and onto the front surface of the shield.

Referring to FIG. 2, the shields 82 include front layers 90 that face the coherent radiation sources 80 and back layers 92 that face the wafer position 21. The back layers 92 are preferably made of a material for absorbing the coherent radiation from the coherent radiation sources 80 and reradiating the energy from the beams of coherent radiation toward the wafer position 21. By way of nonlimiting example, the back layers 92 can be made of silicon carbide or a ceramic material such as alumina. The front layers 90 are preferably made of materials that enhance heat uniformity across the back layers 92. For example, each front layer 90 can be made of a material capable of efficiently conducting heat such as a diamond layer or a nanocrystalline diamond layer. In certain embodiments, the front layers can also function to scatter or diffuse the beams of coherent radiation to further enhance heating uniformity of the shields 82.

In one particular embodiment of the present invention, the shields 82 have front layers 90 made of nanocrystalline diamond and a back layers 92 made of alumina. In such an embodiment, each front layer 90 can have a thickness in the range of 2,000–10,000 angstroms, while each back layer 92 can have a thickness in the range of 10,000–100,000 angstroms.

The above-described chemical vapor deposition system 28 can be used for the deposition of high dielectric constant gate dielectrics. Exemplary high dielectric constant materials include 1% magnesium doped tin dioxide, tin dioxide, $Ta_2O_5$, barium strontium titanate (BST) as well as other materials having dielectric constants in the range of 8–5000. The following paragraphs describe an exemplary operating procedure for using the chemical vapor deposition system 28 to deposit a high dielectric constant material on the wafer 20.

In use, the wafer 20 is inserted into the deposition chamber 30 using a conventional wafer transfer mechanism. Within the chamber 30, the wafer 20 is positioned at the wafer position 21 and mounted on the rotatable member 34. The coherent radiation sources 80 are then used to scan beams of coherent radiation across the front surfaces 84 and through the front layers 90 of the shields 82. The back layers 92 of the shields 82 absorb the coherent radiation and reradiate the energy from the beams of coherent radiation toward the wafer 20. The front layers 90 of the shields 82 assist in uniformly transferring heat across the back layers 92. Consequently, the reradiated energy from the back layer 92 is uniformly distributed across the wafer 20.

As the wafer 20 is heated, the wafer 20 is also rotated by the rotatable member 34. Concurrently, one to eight standard cubic centimeters per minute of dichlorostyrene (Si$_2$H$_2$Cl$_2$) is flowed into the deposition chamber 30 through the injectors 36 to clean the wafer 20 and to remove residual oxide. The system is then N$_2$ purged. Thereafter, precursor gases such as Ta(OC$_2$H$_5$)$_5$ are delivered through the injectors 36 and directed toward the wafer 20. After the target high dielectric constant material has been deposited on the wafer 20, the system is again purged with N$_2$ and the wafer 20 is removed from the chamber 30.

The use of a coherent radiation source to heat a wafer, as described above, provides numerous advantages. For example, a coherent radiation source provides accurate and uniform heating of the wafer thereby generating an environment conducive for effective chemical vapor deposition. Heating uniformity can be tuned by changing the scanning pattern of the coherent radiation source 80 or by changing the rotation speed of the wafer 20. Rotating the wafer also helps reduce nucleation of the precursor gases.

With regard to the foregoing description, it is to be understood that changes made be made in detail, especially in matters of the materials employed and the size, shape and arrangement of the parts without departing from the scope of the present invention. It is intended that the specification and depicted aspects of the invention be considered exemplary only with a true scope and spirit of the invention being indicated by the broad meaning of the following claims.

We claim:

1. A chemical vapor deposition system comprising:
   a chemical vapor deposition chamber having a wafer support position at which a wafer is placed during chemical vapor deposition processing;
   a source of reactive gases for providing reactive gases to the chemical vapor deposition chamber, the reactive gas source positioned proximate to the wafer support position;
   a coherent radiation source for directing a beam of coherent radiation toward the wafer support position; and
   a shield positioned between and spaced from the coherent radiation source and the wafer support position for distributing energy from the beam of coherent radiation across the wafer when the wafer is located at the wafer support position.

2. The system of claim 1, wherein the coherent radiation source is selected from the group consisting of: a maser, a magnetron and a klystron.

3. The system of claim 1, wherein the coherent radiation source comprises a laser.

4. The system of claim 1, wherein the beam of coherent radiation is adapted to be incident on the shield and the shield includes a material for absorbing the coherent radiation and re-radiating the energy from the beam of coherent radiation toward the wafer position.

5. The system of claim 4, wherein the material comprises ceramic.

6. The system of claim 5, wherein the ceramic comprises alumina.

7. The system of claim 4, wherein the material comprises silicon carbide.

8. The system of claim 1, wherein the shield includes a diamond layer.

9. The system of claim 1, wherein the shield includes a nanocrystalline diamond layer.

10. The system of claim 1, wherein shield includes a first layer for absorbing the coherent radiation, and a second layer for enhancing heat uniformity across the first layer.

11. The system of claim 10, wherein the second layer comprises diamond.

12. The system of claim 10, wherein the second layer comprises nanocrystalline diamond.

13. The system of claim 1, further comprising a drive mechanism for rotating the wafer within the chemical vapor deposition system.

14. The system of claim 13, wherein the wafer includes a wafer opening, and the drive mechanism includes a rotatable member sized and shaped to extend at least partially through the wafer opening.

15. The system of claim 14, wherein the rotatable member has an axis of rotation that is generally horizontal.

16. A chemical vapor deposition system comprising:
    a chemical vapor deposition chamber having a wafer support position at which a wafer is placed during chemical vapor deposition processing;
    a source of reactive gases for providing reactive gases to the chemical vapor deposition chamber, the reactive gas source positioned proximate to the wafer support position;
    a coherent radiation source for directing a beam of coherent radiation toward the wafer position; and
    a shield interposed between and spaced from the coherent radiation source and the wafer support position for distributing energy from the beam of coherent radiation across the wafer when the wafer is located at the wafer position, the shield including a layered structure for absorbing the coherent radiation and re-radiating the energy from the beam of coherent radiation toward the wafer support position.

17. The system of claim 16, wherein the coherent radiation source is selected from the group consisting of a maser, a magnetron, a klystron and a laser.

18. The system of claim 17, wherein the layer structure of the shield includes a first layer exposed to the coherent radiation source, adapted to absorb the coherent radiation, and a second layer for enhancing heat uniformity across the first layer.

19. The system of claim 18, wherein the first layer is composed of a material selected from the group consisting of alumina and silicon carbide.

20. The system of claim 19, wherein the second layer is composed of a material selected from the group consisting of diamonds and nanocrystalline diamonds.

21. The system of claim 20, wherein the beam of coherent radiation is directed to at least one mirror for scanning the radiation along the first layer of the shield.

22. The system of claim 21, further comprising a drive mechanism for rotating a wafer within the chemical vapor deposition system, wherein the wafer includes a wafer opening and the drive mechanism includes a rotatable member sized and shaped to extend at least partially through the wafer opening.

23. A chemical vapor deposition system comprising:
    a chemical vapor deposition chamber having a wafer support position at which a wafer is placed during chemical vapor deposition processing;
    a source of reactive gases for providing reactive gases to the chemical vapor deposition chamber, the reactive gas source positioned proximate to the wafer support position;
    a coherent radiation source for directing a beam of coherent radiation toward the wafer support position;
    a shield interposed between and spaced from the coherent radiation source and the wafer support position for distributing energy from the beam of coherent radiation across the wafer when the wafer is located at the wafer support position, the shield including a first layer for absorbing the coherent radiation and a second layer for enhancing heat uniformity across the first layer.

24. The system of claim 23, wherein the coherent radiation source is selected from the group consisting of: a maser, a magnetron, a klystron and a laser.

25. The system of claim 24, wherein the first layer is composed of a material selected from the group consisting of alumina and silicon carbide.

26. The system of claim 25, wherein the second layer is composed of a material selected from the group consisting of diamonds and nanocrystalline diamonds.

27. The system of claim 23, wherein the beam of coherent radiation is directed to at least one mirror for scanning the coherent radiation along the first layer of the shield.

28. The system of claim 27, further comprising a drive mechanism for rotating a wafer within the chemical vapor deposition system, wherein the wafer includes a wafer opening and the drive mechanism includes a rotatable member sized and shaped to extend at least partially through the wafer opening.

29. The system of claim 1, wherein the source of reactive gases includes jet gas injectors disposed within the chamber between the shield and the wafer support position.

30. The system of claim 1, wherein the coherent radiation source is a first radiation source positioned on one side of the chamber opposite a first surface of the wafer in the wafer support position, the system further including a second coherent radiation source positioned on the side of the chamber opposite a second surface of the wafer.

31. The system of claim 30, further including a second shield located between and spaced from the second coherent radiation source and the wafer support position.

32. The system of claim 31, wherein the coherent radiation source is selected from the group consisting of: a maser, a magnetron, a klystron and a laser.

33. The system of claim 32, wherein the shields include a layered structure for absorbing the coherent radiation and re-radiating the energy from the beam of coherent radiation toward the wafer support position.

34. The system of claim 33, wherein the shields include a first layer for absorbing the coherent radiation and a second layer for enhancing heat uniformity across the first layer.

35. The system of claim 34, wherein the first layer is composed of a material selected from the group consisting of alumina and silicon carbide.

36. The system of claim 35, wherein the second layer is composed of a material selected from the group consisting of diamonds and nanocrystalline diamonds.

37. The system of claim 32, wherein the beam of coherent radiation is directed to at least one mirror for scanning the coherent radiation along the first layer of the shield.

38. The system of claim 37, further comprising a drive mechanism for rotating a wafer within the chemical vapor deposition system, wherein the wafer includes a wafer opening, and the drive mechanism includes a rotatable member sized and shaped to extend at least partially through the wafer opening.

* * * * *